(12) United States Patent
Müller et al.

(10) Patent No.: US 6,183,272 B1
(45) Date of Patent: *Feb. 6, 2001

(54) COMPRESSIBLE ELASTOMERIC CONTACT AND MECHANICAL ASSEMBLY THEREWITH

(75) Inventors: Marcus Müller, Sindelfingen; Rolf Neuweiler, Magstadt, both of (DE)

(73) Assignee: Hewlett-Packard Company, Palo Alto, CA (US)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/093,485

(22) Filed: Jun. 8, 1998

(30) Foreign Application Priority Data

Jul. 4, 1997 (EP) .................................................. 97111370

(51) Int. Cl.⁷ ........................................................ H01R 4/58
(52) U.S. Cl. ................................................ 439/91; 439/66
(58) Field of Search ................................ 439/91, 66, 591

(56) References Cited

U.S. PATENT DOCUMENTS

| 4,201,435 | 5/1980 | Nakamura et al. | 439/91 |
| 4,593,961 | * 6/1986 | Cosmo | 439/66 |
| 5,229,917 | * 7/1993 | Harris et al. | 439/66 |
| 5,500,280 | 3/1996 | Yamazaki et al. | 428/220 |

FOREIGN PATENT DOCUMENTS

| 238410A2 | 3/1987 | (EP) . |
| 558855A2 | 12/1992 | (EP) . |
| 2054284A | 6/1980 | (GB) . |
| 2269061A | 1/1994 | (GB) . |
| 2276502A | 9/1994 | (GB) . |
| WO96/22621 | 7/1996 | (WO) . |

OTHER PUBLICATIONS

ShinEtsu Shineflex catalog, pp. 11, 20, May 1994.*
European Search Report, EP 97 11 1370, Dec. 8, 1997.

* cited by examiner

*Primary Examiner*—T. C. Patel

(57) ABSTRACT

An elastomeric contact provides an electrical contact, including a stabilizing unit with one or more conductive elements embedded into a strengthening material, whereby the stabilizing unit again is embedded into a compressible material. Further described is a mechanical assembly for contacting a plurality of electronic modules comprising a contacting arrangement with the elastomeric contact and a positioning frame for positioning the elastomeric contact, the contacting arrangement being arranged between adjacent ones of the plurality of electronic modules.

9 Claims, 5 Drawing Sheets

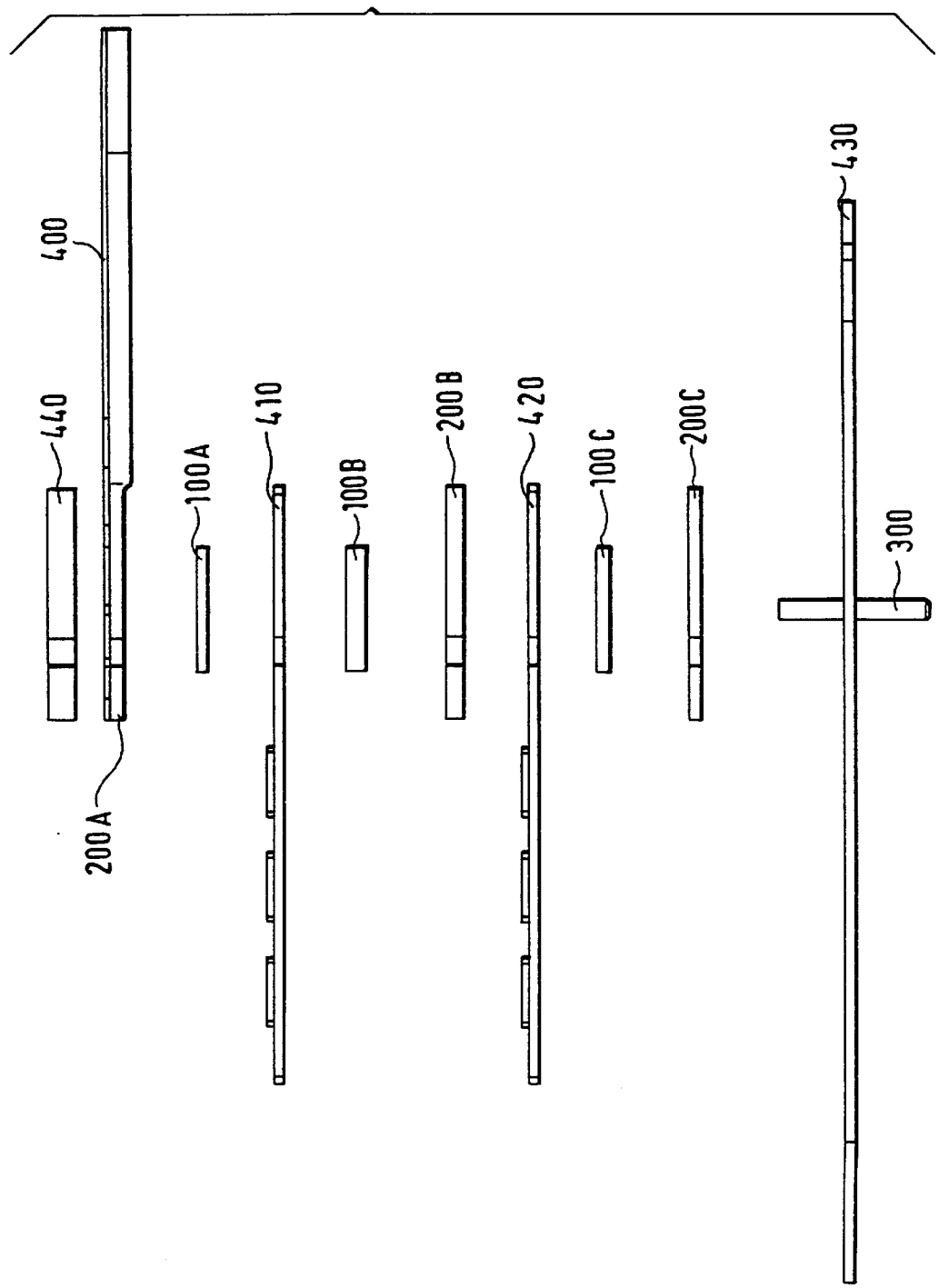

COMPRESSIBLE ELASTOMERIC CONTACT AND MECHANICAL ASSEMBLY THEREWITH

BACKGROUND OF THE INVENTION

The present invention generally relates to elastomeric contacts, and in particular to contacting arrangements and mechanical assemblies for contacting a plurality of electronic modules.

In complex electronic systems comprising a plurality of electronic modules and PC-boards (and therefore may have a high count of electrical contacts), the mechanical and electronic assembling of those modules and PC-boards has become more and more important. This is, on one hand, due to more and more complex and integrated structures and constraints in assembling space, and on the other hand, due to heat and cooling problems involved within the electronic system. Furthermore, a modular assembling is desirable.

Mechanical and electronic contacts provided by elastomeric materials (elastomeric contacts) are often used for achieving detachable connections. EP-A-0 238 410 and EP-A-0 558 855 disclose arrangements which use such elastomeric contacts for providing a resilient contact.

FIG. 1 shows the principal structure of an elastomeric contact 10 as known in the art. Elastomeric contacts 10 are electrically conductive contact media fibers, and an elastic carrier 30 such as silicone rubber, whereby the conductive elements 20 are normally embedded into the elastic carrier 30.

By applying pressure on adjacent sides of the elastomeric contact 10, e.g. by pressing the elastomeric contact 10 between a first PC-board 40 and a second PC-board 50, the carrier material 30 deforms elastically and the conductive elements 20 get in touch with corresponding contact areas of the first and second PC-board 40 and 50, and thus establish an electrical (and mechanical) contact between the first and second PC-board 40 and 50. The conductive elements 20 within the elastic carrier 30 can be arranged e.g. in rows (as indicated in FIG. 1) or in any other desired order.

A variety of elastomeric contacts 10 based on solid insulating silicone rubber is provided as GB-type inter-connectors by Shin-Etsu Polymer Company Ltd, Japan. For connecting small-pitch PC-boards, insulating sponge rubber may be applied to the solid rubber for support, as provided as a GN-type inter-connectors by Shin-Etsu Polymer Company Ltd, Japan.

GB-A-2 269 061 and U.S. Pat. No. 4,201,435 disclose elastomeric contacts, each comprising a unit with conductive elements embedded into a resilient material. In WO-A-96 22621, the conductive elements are partly embedded into a strengthening material. This unit is further embedded into a flexible and resilient material. Other elastomeric contacts are disclosed in U.S. Pat. No. 5,500,280 and GB-A-2 054 284.

It has been found that only a limited amount of pressure can be applied onto those elastomeric contacts 10 as known in the art, when a contact as shown in FIG. 1 is to be established. This is due to the elastic properties of the elastic carrier 30, so that the elastomeric contact 10 tends to "flow" when pressure is applied, meaning that the elastomeric contact 10 changes its internal and external shape and lateral dimensions under the influence of pressure. Particularly when the elastomeric contact 10 comprises a plurality of rows of conductive elements 20, the position of the contact areas of the elastomeric contact 10 provided by the individual conductive elements 20 might vary. This can lead to a mismatch in position of the contact areas of the elastomeric contact 10 with respect to the respective contact areas to be contacted, e.g. of the first and second PC-board 40 and 50, and thus to contact defects such as higher resistance or that no contact is established. Furthermore, the elastomeric contact 10 generally does not allow a thermal contact between the modules to be contacted, due to the low thermal conductivity of the elastomeric contact 10. GB-A-2 276 502 discloses an anisotropic conductive elastic connector comprising vertical conductive elements which are embedded into 3 horizontal layers of insulative elastic sheets, whereby a layer formed of a compressible foam synthetic resin material is provided between two adjacent layers formed of a resilient non-foam synthetic resin material. GB-A-2 276 502 overcomes the above mentioned disadvantages and solves the problem of "flowing". However, disadvantageous in the arrangement of GB-A-2 276 502 is that this arrangement is difficult to manufacture, e.g., since the conductive elements have to be kept aligned during the manufacturing process until all layers have been sequentially applied.

It is therefore an object of the present invention to provide a compressible elastomeric contact which is easier to manufacture.

As pointed out above, elastomeric contacts are often applied in contacting arrangements for providing an electrical contact between electronic modules. GB-A-2 276 502 further discloses a contacting arrangement for providing an electrical contact between a wiring board and an IC package. The arrangement comprises the above described elastomeric contact and a connector frame for positioning the elastomeric contact.

It is a further object of the invention to provide another contacting arrangement for providing an electrical contact between electronic modules.

SUMMARY OF THE INVENTION

An elastomeric contact according to a first aspect of the invention, for providing an electrical contact, comprises a stabilizing unit with one or more conductive elements embedded into a strengthening material. The stabilizing unit again is embedded into a compressible material.

An elastomeric contact according to a second aspect of the invention comprises a plurality of compressible layers of a compressible material; and a plurality of contact layers of a strengthening material, each with at least one embedded conductive element; whereby each one of the plurality of contact a layers is arranged between adjacent ones of the compressible layers.

In the elastomeric contact according to the invention, the compressible material will be compressed under the influence of pressure. Due to the arrangement of compressible materials and strengthening materials within the elastomeric contact, a "flowing" of the strengthening material and thus of the conductive elements under the influence of pressure is reduced to a minimum degree. In case that an arrangement of a plurality of individual layers is selected, wherein adjacent layers of strengthening material are separated by one layer of compressible material, the "flowing" of one individual layer or of the strengthening material will not influence a next layer of strengthening material, or only to a minimum degree.

The elastomeric contact according to the invention thus allows an increased amount of pressure to be applied onto the elastomeric contacts. A mismatch in position of contact areas of the elastomeric contact with respect to respective contact areas to be contacted will be avoided.

A contacting arrangement according to a third aspect of the invention, for providing an electrical contact between a first and a second module, comprises a compressible elastomeric contact according the first or second aspect, and a positioning frame for positioning the elastomeric contact. The positioning frame has substantially the same inner dimensions as the outer dimensions of the elastomeric contact, and the height of the elastomeric contact is at least slightly greater than the height of the positioning frame.

The contacting arrangement allows an easy and precise positioning of the elastomeric contact. Furthermore, an improved thermal contact between modules to be contacted can be established when the contacting arrangement is pressed between the modules, and particularly when the positioning frame is provided as a thermally high conductive material.

A mechanical assembly according to a forth aspect of the invention, for contacting a plurality of electronic modules, comprises the contacting arrangement according to the third aspect arranged between adjacent ones of the plurality of electronic modules.

The mechanical assembly allows an easy handling and contacting of a plurality of modules to be contacted, and can be extended to a great amount of modules, generally only limited by constraints such as mechanical tolerances. The entire mechanical assembly represents one single mechanical assembly independent of the number of modules to be contacted.

A method for providing an electrical contact according to a first aspect of the invention comprises the steps of embedding one or more conductive elements into a strengthening material to a stabilizing unit, and embedding the stabilizing unit into a compressible material.

A method for providing an electrical contact according to the invention comprises the steps of providing a first layer of a compressible material, providing a second layer of a strengthening material with a first row of a plurality of embedded conductive elements, providing a third layer of the compressible material, providing a fourth layer of the strengthening material with a second row of a plurality of embedded conductive elements, and providing a fifth layer of the compressible material.

BRIEF DESCRIPTION OF THE DRAWINGS

Other objects and many of the attendant advantages of the present invention will be readily appreciated and become better understood by reference to the following detailed description when considering in connection with the accompanied drawings, in which:

FIGS. 6*a* and 6*b* show an arrangement based on the arrangement of FIG. 5 comprising a plurality of vertically stacked modules to be electronically and/or thermally connected.

DETAILED DESCRIPTION OF THE INVENTION

Figure 1:
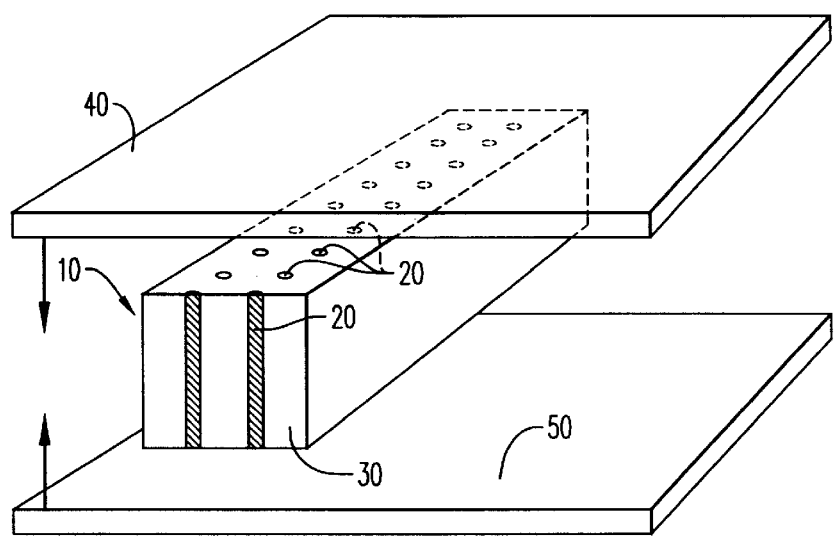
FIG. 1 shows the principal structure of an elastomeric contact 10 as known in the art.
Figure 2:
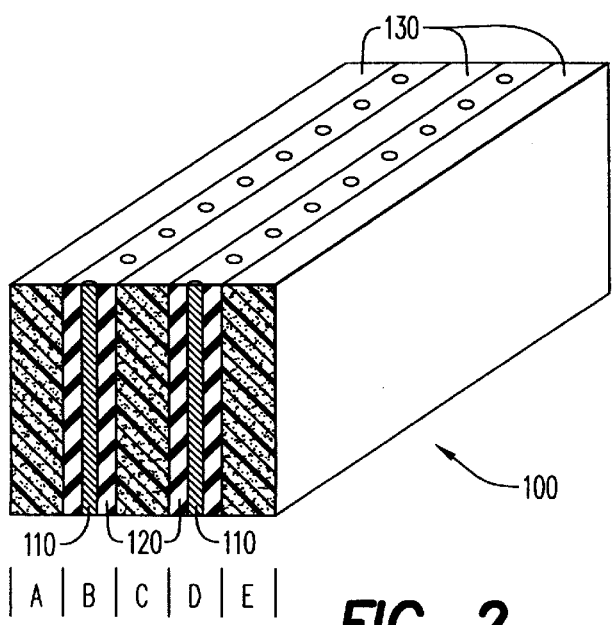
FIG. 2 shows the principal structure of an elastomeric contact 100 according to the invention.

FIG. 2 shows the principal structure of an elastomeric contact 100 according to the invention. The elastomeric contact 100 at least comprises one or more conductive elements 110 arranged within a strengthening material 120, which again is embedded into a compressible material 130.

FIG. 2 explains the structure of a multi-row elastomeric contact 100 by example of a two-rows elastomeric contact 100 comprising two rows of conductive elements 110. The elastomeric contact 100 comprises an arrangement of a first layer A of the compressible material 130 a second layer B of the strengthening material 120 with a row of a plurality of embedded conductive elements 110, a third layer C of the compressible material 130, a fourth layer D of the strengthening material 120 again with a row of a plurality of embedded conductive elements 110, and a fifth layer E of the compressible material 130. In order to provide multi-row elastomeric contact 100, the arrangement of the layers ABC can be repeated several times, whereby a layer of compressible material 130 respectively provides the outside layers and is arranged between each respective layer of strengthening material 120 with a row of a plurality of embedded conductive elements 110, as indicated by the arrangement of the layers ABCDE as shown in FIG. 2. The arrangement of the one or more conductive elements 110 within the strengthening material 120 can be on demand dependent on the specific application and in any possible order such as a row of individual conductive elements 110 as indicated in FIG. 2, one joined conductive element 110, or the like.

The compressible material 130 can be any kind of material behaving compressible under the influence of pressure. This can preferably be accomplished by embedding occlusions of gas such as in foam or sponge materials. The compressible material 130 is preferably a silicone foam or sponge.

The strengthening material 120 can be any kind of material suitable for embedding conductive elements 110 and to assure—to a certain extend—the stability of the shape of the conductive elements 110 within the strengthening material 120. It also has to provide a good electrical insulation between the single conductive elements 110. The strengthening material 120 is preferably a silicone material, e.g. a silicone rubber.

The conductive elements 110 can comprise e.g. a plurality of individual copper fibers or wires, individual metal fibers or wires, or carbon stripes.

The layers ABCDE need not necessarily be a flat 'plate'-arrangement as shown in FIG. 2, but can be in any desired shape as required, dependent on the specific application. However, since most of the PC-boards to be contacted provide their contact areas in strict row shapes, the flat 'plate'-arrangement of the layers ABCDE as shown in FIG. 2 will be the most common.

In case of an applied pressure, the compressible material 130 will be compressed and substantially maintaining its internal and external shape and lateral dimensions, whereas the strengthening material 120 can substantially not be compressed and will "flow" under the influence of the pressure.

However, due to the arrangement according to the invention of compressible materials 130 and strengthening materials 120 within the elastomeric contact 100, the "flowing" of the strengthening material 120 and thus of the conductive elements 110 under the influence of pressure is reduced to a minimum. Furthermore, due to the arrangement ABCDE of a plurality of individual layers, wherein adjacent layers of strengthening material 120 are separated by one layer of compressible material 120, the "flowing" of one individual layer B or D or of the strengthening material 120 will not influence a next layer of strengthening material 120, or only to a minimum degree.

Figure 3:
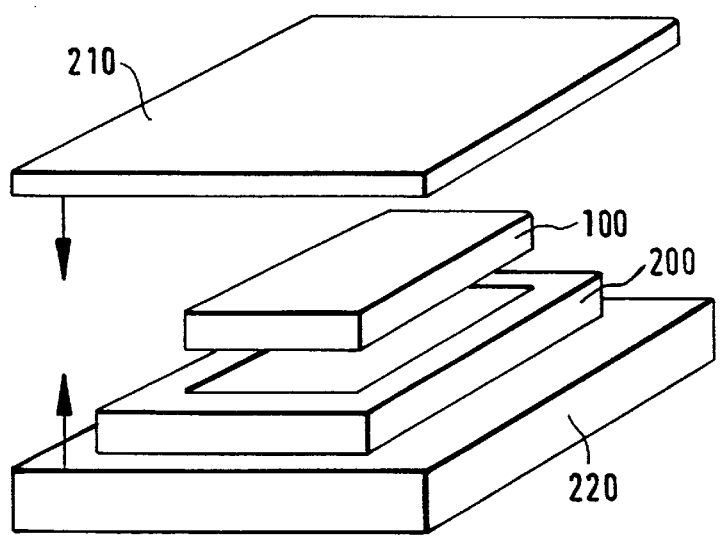
FIG. 3. shows an arrangement with the elastomeric contact inserted into a positioning frame.

The elastomeric contact 100 is preferably used in an arrangement as depicted in FIG. 3. The elastomeric contact 100 is inserted into a positioning frame 200 and pressed between a first module 210 and a second module 220 to be connected with one another by the elastomeric contact 100. The positioning frame 200 positions and centers the elastomeric contact 100 and may also establish a thermal contact between the modules 210 and 220. It also limits the compressible height of the elastomeric contact 100 in order to preserve it from being overpressed.

In case that a thermal contact is to be established between the modules 210 and 220, the positioning frame 200 is preferably a metal frame or made of other thermally high conducting materials. In case that no thermal contact is desired or an insulation is to be established, the positioning frame 200 may also be made of any kind of coated metal or plastic material suitable for the specific application.

Figure 6A:
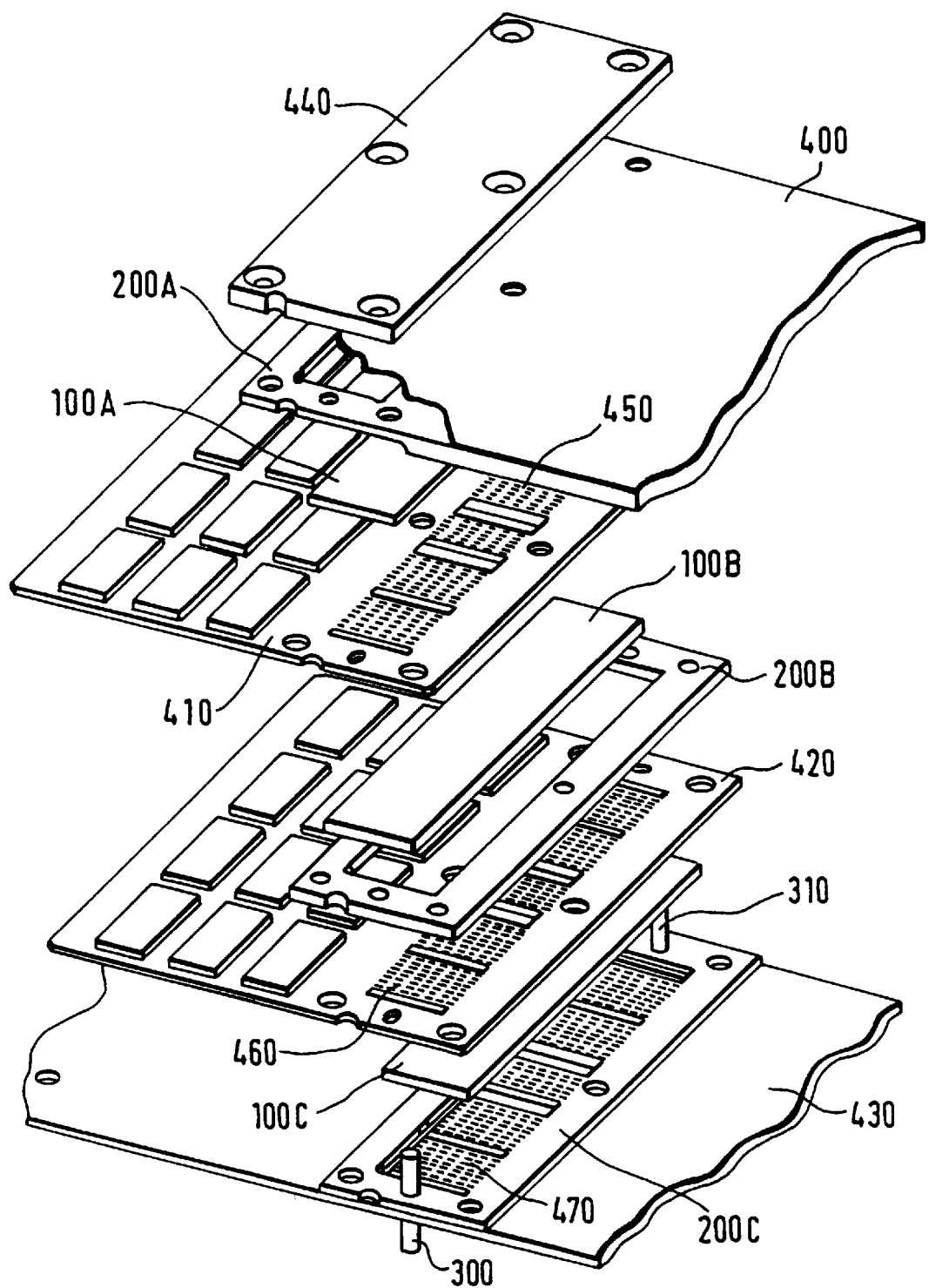

The positioning frame 200 can either be a separate unit (as demonstrated in FIG. 3) or integrated within other functional units, e.g. within one of the modules 210 or 220 (see e.g. FIGS. 6a and 6b, wherein positioning frame 200A is integrated into PC-board 400). The positioning frame 200 has preferably substantially the same inner dimensions as the outer dimensions of the elastomeric contact 100, in order to provide as a precise fitting of the elastomeric contact 100 within the positioning frame 200.

Figure 4:
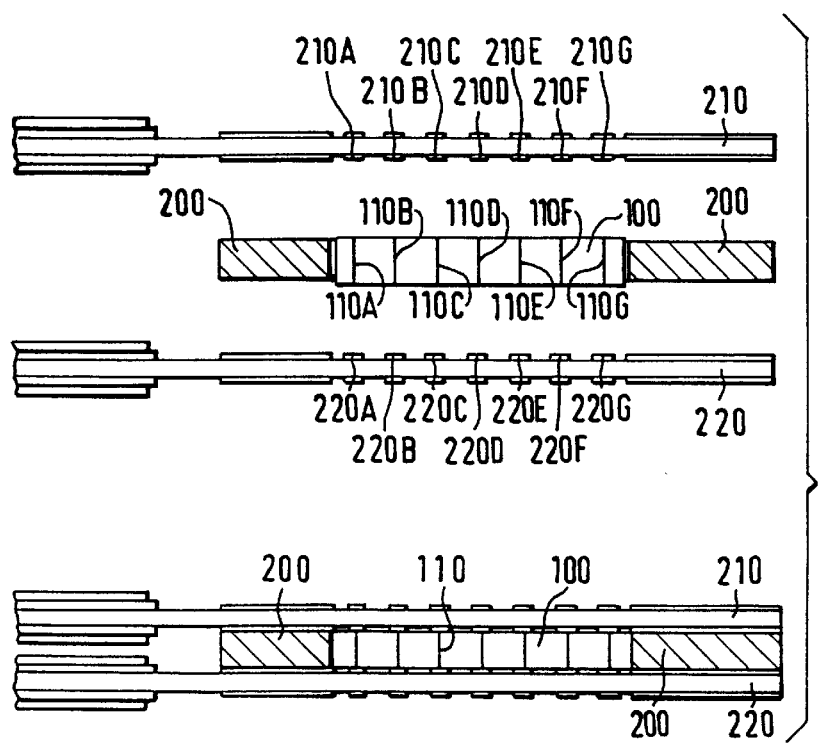
FIG. 4 depicts the arrangement of FIG. 3 in a sectional view, whereby the upper part of FIG. 4 shows the arrangement before contacting the modules, and the lower part of FIG. 4 shows the arrangement after establishing the contact between the modules.

FIG. 4 depicts the arrangement of FIG. 3 in a sectional view, whereby the upper part of FIG. 4 shows the arrangement before contacting the modules 210 and 220, and the lower part of FIG. 4 shows the arrangement after establishing the contact between the first and second modules 210 and 220.

The first module 210 comprises a plurality of contacts 210A, 210B, 210C, 210D, 210E, 210F, 210G. The second module 220 comprises a plurality of contacts 220A, 220B, 220C, 220D, 220E, 220F and 220G. The elastomeric contact 100 comprises a plurality of conductive elements 110A, 110B, 110C, 110D, 110E, 110F, and 110G, arranged for example based on the arrangement as shown in FIG. 2. Contact 210A is to be contacted with contact 220A via the conductive element 110A, contact 210B is to be contacted with contact 220B via conductive element 110B, and so on.

In case that occlusions of gas are embedded into the compressible material 130, those occlusions will collapse under the influence of pressure, thus establishing a physical decrease in volume.

In order to provide an improved contact between the contacts of the modules 210 and 220, the height of the elastomeric contact 100 is selected to be at least slightly greater than the height of the positioning frame 200, both in an unpressed state. After pressing (as indicated by the arrows in FIG. 3), the elastomeric contact 100 will have substantially the same height as the positioning frame 200 (as shown in the lower part of FIG. 4). In a preferred embodiment, the height of the elastomeric contact 100 is about 10% greater than the height of the positioning frame 200. Due to the difference in height between the elastomeric contact 100 and the positioning frame 200, the conductive elements 110 are slightly bent under the influence of pressure and the tops of the conductive elements 110 engage or "dig" into the respective contacts to be contacted, thus providing a gastight contact. The strengthening material 120 however prevents the conductive elements 110 from being bent and deformed to an undesirable degree.

By pressing a preferably metallized surface of the modules 210 and 220 onto the positioning frame 200, an improved thermal contact between the modules 210 and 220 is established, and excessive heat may flow from the modules e.g. into an applied heatsink.

In a preferred embodiment, the height of the conductive elements 110 is slightly greater that the height of the strengthening material 120. This results in an improved electrical contact of the conductive elements 110 with the respective contacts to be contacted after pressing, due to an increased force onto the conductive elements 110 during the pressing.

As indicated in the lower part of FIG. 4, the conductive elements 110 might be slightly bent after pressing, thus constituting a stable contact. However, due to the embedding within the compressible material 130, the strengthening material 120 and thus the conductive elements 110 only "flows" to a minimum degree, so that the lateral position of the conductive elements 110 might only be slightly changed under the influence of pressure.

Figure 5:
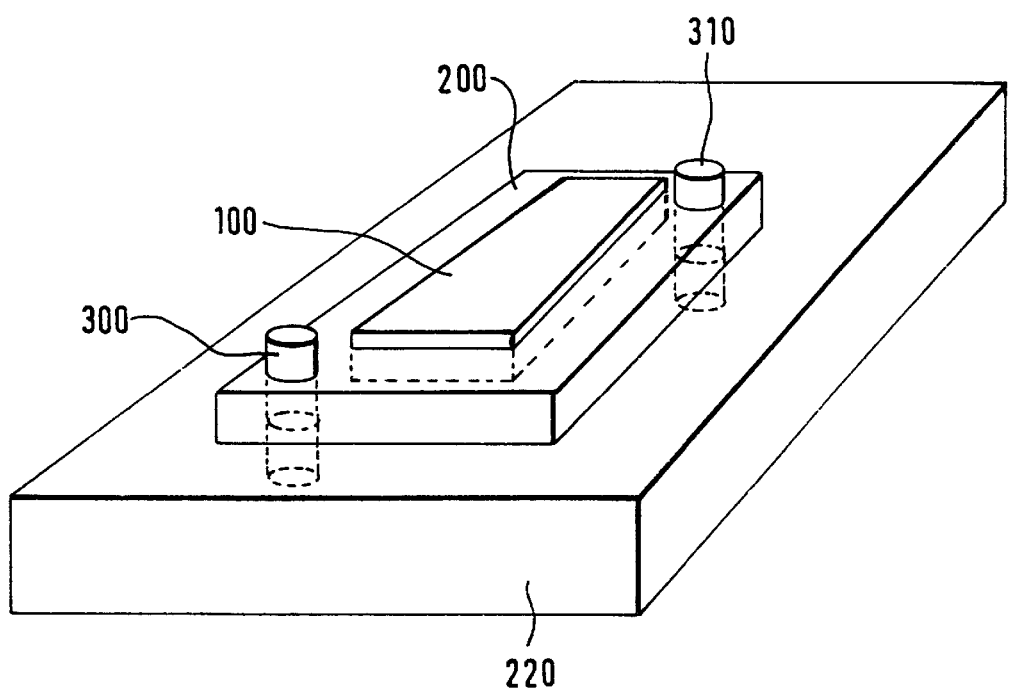
FIG. 5 shows a preferred embodiment of an arrangement for positioning of the positioning frame.

The positioning of the positioning frame 200 and thus of the elastomeric contact 100 can be established by any positioning method and means as known in the art, such as glueing, screwing, taping, etc. FIG. 5 shows a preferred embodiment of an arrangement for positioning of the positioning frame 200. The positioning frame 200 is positioned and centered onto the second module 220 by at least two positioning pins: a first positioning pin 300 and a second positioning pin 310. The positioning pins 300 and 310 are inserted into corresponding holes into the first and second modules 210 and 220 and the positioning frame 200.

FIG. 5 furthers shows the slight overlapping in height of the elastomeric contact 100 over the positioning frame 200 before assembling and pressing the first and second modules 210 and 220. The positioning pins 300 and 310 allow an easy but precise positioning and centering of the positioning frame 200 and thus elastomeric contact 100 for the contacting of the first and second modules 210 and 220.

FIGS. 6a and 6b show an arrangement based on the arrangement of FIG. 5, comprising a plurality of vertically stacked ("piled" up) modules 400, 410, 420, and 430 to be electronically and/or thermally connected. The arrangement is depicted in FIG. 6a in an isometric view and in FIG. 6b in side view. In the example of FIGS. 6a and 6b, the modules 400 and 430 represent PC-boards, whereas the modules 410, 420, and 430 represent memory modules which may be optionally assembled between the PC-boards 400 and 430. The elastomeric contacts 100A, 100B, and 100C are respectively positioned and centered within corresponding positioning frames 200A, 200B, and 200C. One of the elastomeric contacts 100A, 1008, and 100C within the corresponding one of the positioning frames 200A, 200B, and 200C is positioned between adjacent sides of the modules 400, 410, 420, and 430, as apparent from FIGS. 6a and 6b.

In the example of FIGS. 6a and 6b, the positioning frame 200A is provided as a thermally higher conductive metal frame and is integrated within module 400 which also serves as a heatsink for the positioning frame 200A. The positioning and centering of the positioning frames 200A, 200B, and 200C is accomplished by the first positioning pin 300 and the second positioning pin 310. A pressure plate 440 is further positioned by the positioning pins 300 and 310 in order to provide a sufficient vertical contact pressure on the stacked modules 400, 410, 420, and 430, the elastomeric contacts 100A, 100B, and 100C, and the positioning frames 200A, 200B, and 200C.

The elastomeric contacts 100A, 100B, and 100C respectively provide electrical contacts between corresponding contact areas (e.g. contact arrays 450, 460, and 470 as visible in FIG. 6; further contact arrays are provided on corresponding sides of the adjacent modules) on the modules 400, 410, 420, and 430. The contact areas can be any contacting means as known in the art, e.g. comprising individual contact pads and vias (e.g. through-hole, buried, or blind vias).

It is to be understood, that the arrangement as shown in FIGS. 6a and 6b can be extended to a great amount of modules to be contacted, generally only limited by constraints such as mechanical tolerances. The entire arrangement represents one single mechanical assembly independent of the number of modules to be contacted.

What is claimed is:

1. An elastomeric contact for providing an electrical contact, comprising:

a stabilizing unit having one or more conductive elements embedded into a substantially non-compressible strengthening material, said substantially non-compressible strengthening material adapted to maintain its original volume while flowing in response to applied pressure, a compressible material into which the stabilizing unit is embedded, said compressible material including embedded voids that enable said compressible material to experience a volumetric reduction while maintaining its original lateral dimensions in response to applied pressure, wherein, in response to applied pressure, said compressible material inhibits the flowing of said substantially non-compressible material which, in turn, inhibits a bending and misalignment of said conductive elements.

2. An elastomeric contact for providing an electrical contact, comprising an arrangement of:

a first supporting unit comprising a layer of compressible material, said compressible material having initial lateral dimensions, said compressible material including embedded voids that enable said compressible material to experience a volumetric reduction while substantially maintaining said initial lateral dimensions in response to applied pressure, a first layer of substantially non-compressible strengthening material separating a first plurality of embedded conductive elements, said substantially non-compressible strengthening material adapted to maintain its original volume while flowing in response to applied pressure, a second supporting unit comprising said compressible material;

a second layer of said substantially non-compressible strengthening material separating a second plurality of embedded conductive elements, and a third supporting unit comprising said compressible material, wherein in response to applied pressure, said compressible material inhibits the flowing of said substantially non-compressible material, which, in turn, inhibits a bending and misalignment of said conductive elements.

3. A contacting arrangement for providing an electrical contact between a first and a second module, the arrangement comprising a compressible elastomeric contact, and a positioning frame for positioning the elastomeric contact, wherein:

the elastomeric contact is built according to claim 1, the positioning frame has substantially same inner dimensions as outer dimensions of the elastomeric contact and a height of the elastomeric contact is at least slightly greater than a height of the positioning frame.

4. The contacting arrangement of claim 3, wherein the positioning frame is made of a thermally nigh conductive material.

5. The contacting arrangement according to claim 3, further comprising at least one positioning means arranged between said first and second module for positioning the positioning frame.

6. A mechanical assembly for contacting a plurality of electronic modules, comprising the contacting arrangement according to claim 3, arranged between adjacent ones of the plurality of electronic modules.

7. The elastomeric contact of claim 1, further comprising a plurality of electronic modules in contact therewith.

8. The contacting arrangement according to claim 3, further comprising a plurality of electronic modules in contact therewith.

9. The mechanical assembly of claim 6, further comprising a plurality of electronic modules in contact therewith.

* * * * *